United States Patent [19]

Marathe

[11] 3,997,765
[45] Dec. 14, 1976

[54] CIRCULATING SHIFT REGISTER INCREMENTER/DECREMENTER

[75] Inventor: Vijay V. Marathe, Loveland, Colo.

[73] Assignee: Hewlett-Packard Company, Palo Alto, Calif.

[22] Filed: July 14, 1975

[21] Appl. No.: 595,655

[52] U.S. Cl. .......................... 235/92 SH; 235/92 R; 235/92 BD; 340/173 RC
[51] Int. Cl.² ..................................... H03K 27/00
[58] Field of Search ........ 235/92 SH, 92 BD, 92 T, 235/92 GT, 92 EU; 328/37; 340/173 RC

[56] References Cited

UNITED STATES PATENTS

| | | | |
|---|---|---|---|
| 3,521,036 | 7/1970 | Bartlett et al. | 235/92 SH |
| 3,566,097 | 2/1971 | Hildebrandt | 235/92 SH |
| 3,649,815 | 3/1972 | Clifford | 235/92 GT |

*Primary Examiner*—Joseph M. Thesz
*Attorney, Agent, or Firm*—F. D. LaRiviere

[57] ABSTRACT

The circulating shift register time-keeping circuit described herein includes an incrementer/decrementer that increments and decrements the contents of both clock and stopwatch registers and performs reset and carry functions therefor.

15 Claims, 5 Drawing Figures

CIRCULATING SHIFT REGISTER INCREMENTER/DECREMENTER

BACKGROUND AND SUMMARY OF THE INVENTION

Circulating shift register time-keeping circuits are known in the prior art, see, for example, U.S. Pat. Application Ser. No. 492,303 entitled "Circulating Shift Register Time-Keeping Circuit" filed by France Rode et al. on July 26, 1974. In operation, real time data circulates in serially connected delay elements comprising a circulating shift register (CSR) which is clocked at a predetermined circulation rate. With every complete circulation of the CSR, the data word representing the lowest unit of time data available for readout by the user is incremented by an adder through which the data circulates before re-entering the shift register. In such systems, the rate at which the time data is incremented may be selected to suit the frequency of circulation of that data in the shift register and may actually correspond to the smallest unit of time available to the user.

The operation of a binary adder is described for a time-keeping circuit in the above-mentioned patent application. Since the binary adder only increments, other means must be provided for necessary carry functions between digits and for resetting prior digits to initial values. For example, when the hundredths-of-a-second digit (0.01) is incremented to a value of 0.09, the next increment of that digit must cause a carry of the tenths-of-a-second digit (0.1) and reset of the 0.01 digit from 9 to 0. Means for performing these carry and reset functions are also discussed in the above-referenced patent application (see, for example, the discussion of the operation of adder controller 43 in conjunction with auxiliary register 45 therein).

The incrementer/decrementer of the present invention increments, decrements and performs the carry and reset functions for the contents of circulating shift register memories, and is useful in both clock and stopwatch applications. BCD code has been selected for the preferred embodiment because the incrementer must operate on four-bit digits and count only from 0 through 9. Thus, when a 9 is detected in the first digit (1001 in BCD), then the incremented result should not be a 10 (1010) but rather a 0 (0000), with a "carry" to the next digit.

The preferred embodiment of the present invention comprises a flip-flop, two exclusive OR gates, two exclusive NOR gates and an AND gate. The circuit decrements or increments the contents of a circulating shift register memory in response to appropriately timed control signals as those contents circulate therethrough.

DESCRIPTION OF THE PREFERRED EMBODIMENT

Figure 1:
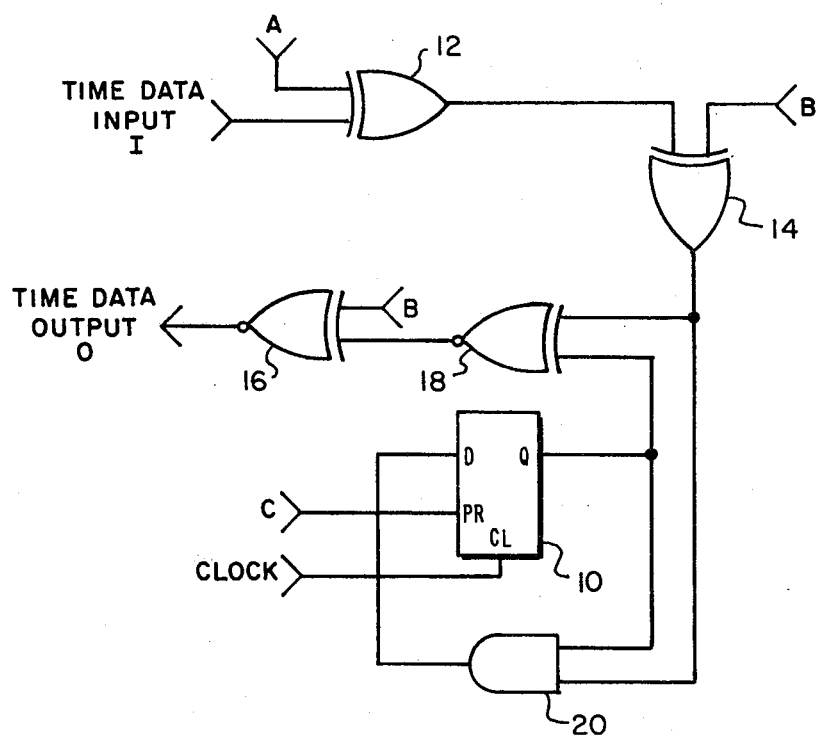
FIG. 1 is a logic diagram of an incrementer/decrementer constructed according to the preferred embodiment of the present invention.

Referring to FIG. 1, the preferred embodiment of the present invention comprises carry flip-flop 10, exclusive OR gates 12 and 14, exclusive NOR gates 16 and 18, and AND gate 720. Each of the eight digits of time data (i.e. 0.01, 0.1, 1.0 and 10 seconds digits; 1.0 and 10 minutes digits; and 1.0 and 10 hours digits) comprises four time data bits. Control signal A enables the complementing of particular data bits for resetting time data digits as time passes. This is logic 1 during the selected bit of a four-bit digit to be complemented. When no bit complement is required, this signal is logic 0 (positive logic signal convention is assumed for this description). Control signal B determines whether the time data digit is to be incremented or decremented and is logic 0 for increment, logic 1 for decrement. Control signal C presets carry flip-flop 10 (logic 1) for the first bit of each digit for one bit time. Input I receives time data from the output of the CSR, and output 0 applies the incremented or decremented time data to the input of the CSR. The clock signal input to flip-flop 10 is synchronous with the clock or timing signal of the CSR being incremented or decremented and therefore the same as time data bit timing.

Figure 2A:
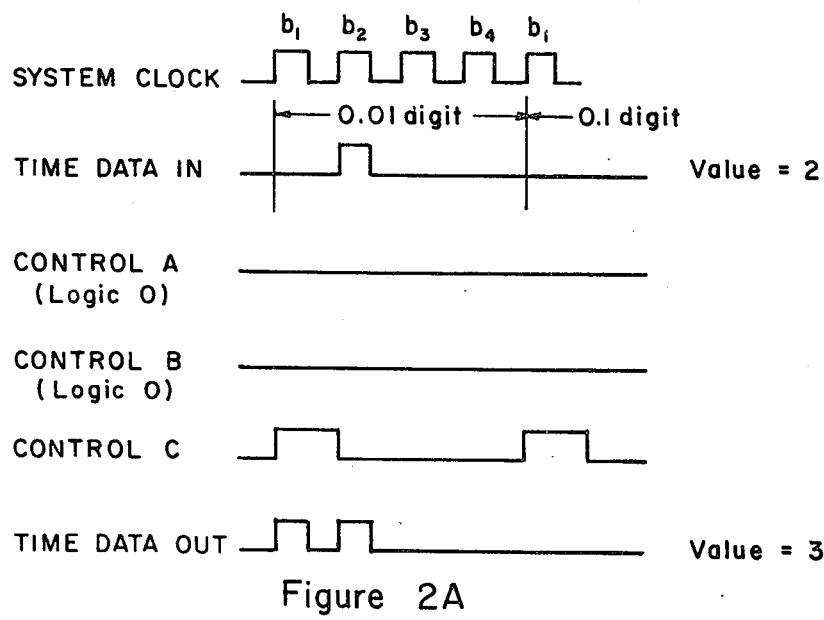
FIG. 2a is a timing diagram showing the relative duration and timing of the control signals and time data for the incrementer/decrementer of FIG. 1 while incrementing when carry or reset functions are not required.
Figure 2B:
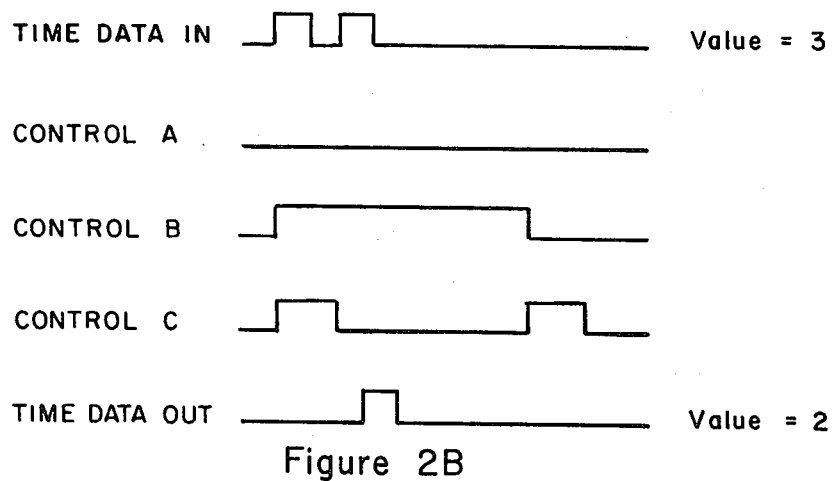
FIG. 2b is a timing diagram showing the relative duration and timing of the control signals and time data for the incrementer/decrementer of FIG. 1 while decrementing when carry or reset functions are not required.

As shown in FIGS. 2a and 2b, during operation as an incrementer, control signals A and B are logic 0. Control C is logic 1 for the first bit time of each digit, then is logic 0 for the remaining three-bit times. For operation as a decrementer, control signal A is logic 0, control signal B is logic 1, and control signal C is the same as for incrementing.

Figure 2C:
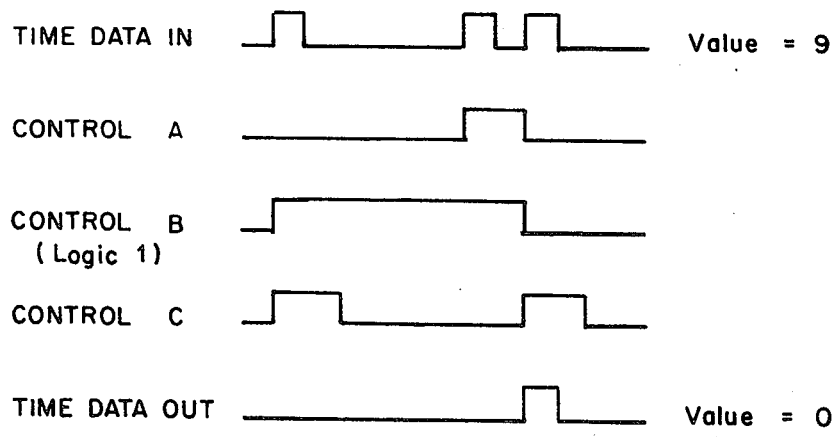
FIG. 2c is a timing diagram showing the relative duration and timing of the control signals and time data for the incrementer/decrementer of FIG. 1 while incrementing when carry and reset functions are required.

Referring now to FIG. 2c, when the time data for a particular digit, for example, the 0.01 seconds digit, reaches a value of 9, the result of incrementing that digit during the next clock pulse is zero (0) which is obtained by complementing bit four of the four-bit digit. A carry is provided for the 0.1 seconds digit by preset flip-flop 10. Thus

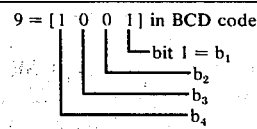

Control signal A = 1 for $b_4$
Control signal A = 0 for $b_1, b_2, b_3$
Control signal B = 1 for $b_1, b_2, b_3, b_4$
Control signal C = 1 for $b_1$ of next digit.

Control signal A = 1 for $b_4$
Control signal A = 0 for $b_1, b_2, b_3$
Control signal B = 1 for $b_1, b_2, b_3, b_4$
Control signal C = 1 for $b_1$ of next digit.

Figure 2D:
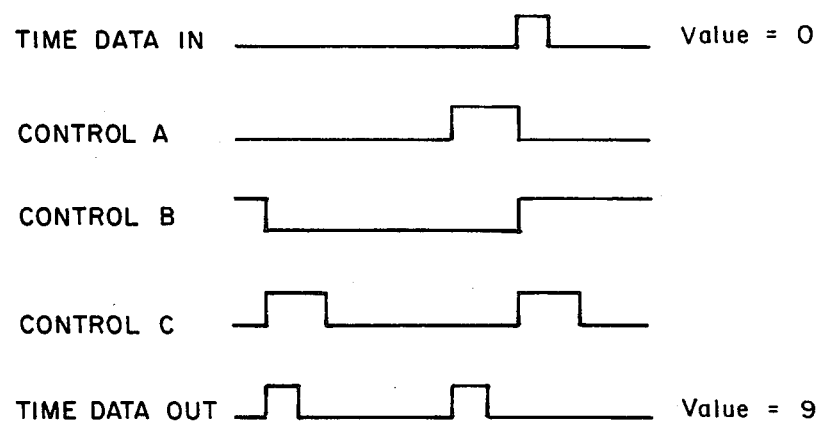
FIG. 2d is a timing diagram showing the relative duration and timing of the control signals and time data for the incrementer/decrementer of FIG. 1 while decrementing when carry and reset functions are required.

For the case of decrementing from 10 to 09, the control signals are the same except that control signal B is logic 0 for all four bits of the digit, as shown in FIG. 2d.

The 0.1 and 1.0 seconds and the 1.0 minutes digits are reset in the same manner. Similarly, the result of incrementing the 10 seconds and the 10 minutes digits is zero during the next clock pulse after reaching a value of 5 and a carry is provided by flip-flop 10 for the next digit. Resetting of the 1.0 and 10.0 hours digits varies with the mode of the clock — i.e., whether in 12 or 24 hour mode. In the 24-hour mode, the 1.0 and 10 hours digits must be reset to zero when the 1.0 hours digit reaches a value of three 59 minutes and 59.99 seconds after the 10 hours digit becomes two. In the 12-hour mode, the 1.0 hours digit must be reset to a value of one 59 minutes and 59.99 seconds after reaching a value of two when the 10 hours digit is one. Tables I and II summarize the action of the circuit for the reset and carry functions discussed above

TABLE I

| Input Digit | Action | Input Digit After Act. | Desired Output Digit |
|---|---|---|---|
| $b_4\ b_3\ b_2\ b_1$ |  | $b_4\ b_3\ b_2\ b_1$ | $b_4\ b_3\ b_2\ b_1$ |
| 1 0 0 1 | Change increment to decrement, complement | 0 0 0 1 | 0 0 0 0 |
| (BCD '9') | $b_4$ and preset carry F/F for next digit. |  |  |
| 0 1 0 1 | Change increment to decrement, complement | 0 0 0 1 | 0 0 0 0 |
| (BCD '5') | $b_3$ and preset carry F/F for next digit |  |  |

In the case of minutes digits, there will be a "carry" from the prior digit — i.e., for the 10 minutes digit, the carry will come from the 1 minute digit, and for the 1 minute digit the carry will come from the 10 seconds digit.

TABLE II

| Input Digit | Action | Input Digit After Action | Desired Output Digit |
|---|---|---|---|
| $b_5\ b_5\ b_4\ b_3\ b_2\ b_1$ |  | $b_4\ b_3\ b_2\ b_1$ | $b_4\ b_3\ b_2\ b_1$ |
| 1 0 0 0 1 1 | Change increment to decrement, | 0 0 0 1 | 0 0 0 0 |
| (BCD 23 hours) and carry F/F preset | complement $b_2$ and preset carry F/F for next digit |  |  |
| 0 0 1 0 | Change increment to decrement, | 0 0 0 1 | 0 0 0 0 |
| and carry F/F preset | complement $b_1$ and $b_2$ and preset carry F/F for next digit |  |  |

Referring to Table II for the 1.0 and 10 hours digits, the circuit "looks ahead" to the first two bits of the following digit. Thus, the 1.0 and 10 hours digits are reset to zero, as shown. Since electronic time-keeping circuits may include a calender CSR having days, months and even years digits, that CSR is incremented in the same manner described for the clock registers, with similar reset and carry functions wherein the 1.0 days digit is incremented when the 1.0 and 10 hours digits are reset to zero in the 24-hour mode or when those digits are reset to one and zero respectively in the 12-hour mode.

The present invention may be used with a stopwatch CSR in two different modes. For applications where an event is timed for total elapsed time (e.g., a race), the register will be incremented in the same manner described, including reset and carry functions. For applications where time is known and time data is preloaded into the register (e.g., boiling a 3-minute egg), that time data will be decremented (i.e. control signal $b$ = logic 1) as summarized in Table III below for the seconds digits.

TABLE III

| Input Digit | Action | Input Digit After Action | Desired Output Digit |
|---|---|---|---|
| $(b_4\ b_3\ b_2\ b_1)$ |  | $(b_4\ b_3\ b_2\ b_1)$ | $(b_4\ b_3\ b_2\ b_1)$ |
| 0 0 0 0 | Change decrement to increment, invert $b_4$ | 1 0 0 0 | 1 0 0 1 |
| 1st "second" digit) | and preset. Carry F/F for next digit |  | (BCD 9) |
| 0 0 0 0 | Change decrement to increment, invert $b_4$ | 0 1 0 0 | 0 1 0 1 |
| (2nd "second") digit) | and preset carry F/F for next digit |  | (BCD 5) |

It should be noted that, using the incrementer/decrementer of the present invention, a stopwatch register can be decremented "through zero," i.e. when time data reaches a value of zero in all registers control signal B can be changed to logic 0 and registers begin incrementing. This feature is useful to determine how much more than the preselected time the egg boiled. Of course, the event of time data reaching zero in all registers may also be used to produce an alarm signal or output control signal for controlling an appliance.

Any form of CSR may be used with the present invention. Furthermore, any combination of logic circuitry or program controlled circuit or combination thereof may be used to generate the clock and control signals. Since the circuit of the present invention will increment, decrement, or perform and carry functions for the contents of a CSR in response to the timed control signals, the timing of those signals will depend upon the particular application which may include time-keeping circuits, counter, and the like.

I claim:

1. A circuit for incrementing and decrementing coded digits of digital data in response to a clock signal and timed control signals, each digit having a plurality of bits and stored in a circulating shift register memory, said circuit comprising:

input gating means coupled to the circulating shift register memory for producing a first output signal in response to the data and first and second control signals;

clocked switching means coupled to the input gating means for producing a second output signal in response to the first output signal, the clock signal and a third control signal, said clock signal being at approximately the same rate as the rate at which data is received by the input gating means; and output gating means coupled to the the input gating means and the clocked switching means for producing coded bits of digital data incremented with respect to the data received by the input gating means, in response to the first and second output signals and the second control signal, said incremented data being produced when the first and second control signals are logic zero for all bits of the digit, and the third control signal is logic one during the first bit of the digit.

2. A circuit as in claim 1 wherein the data produced by said output gating means is decremented with respect to the data received by the input gating means when the first control signal is logic zero and the second control signal is logic one for all bits of the digit.

3. A circuit as in claim 2 wherein a selected digit of data produced by said output gating means is reset to zero on the next clock pulse when the value of that data reaches a preselected value.

4. A circuit as in claim 3 wherein the clocked switching means is preset to increment the next digit of data following the selected digit of data which has been reset to zero.

5. A circuit as in claim 3 wherein the digit of data to be reset is selected by the logic state of the first control signal.

6. A circuit as in claim 1 wherein each digit of the digital data comprises four bits.

7. A circuit as in claim 2 wherein each digit of the digital data comprises four bits.

8. A circuit as in claim 6 wherein the code of the digital data is BCD code.

9. A circuit as in claim 7 wherein the code of the digital data is BCD code.

10. A circuit as in claim 1 wherein the digital data represents the time of day.

11. A circuit as in claim 1 wherein the digital data represents the time of day and month.

12. A circuit as in claim 1 wherein the digital data represents the time of day, month and year.

13. A circuit as in claim 1 wherein the digital data represents elapsed time from a preselected value.

14. A circuit as in claim 1 wherein the digital data represents elapsed time from zero.

15. A circuit as in claim 2 wherein the digital data represents elapsed time from a preselected value.

* * * * *

UNITED STATES PATENT AND TRADEMARK OFFICE
CERTIFICATE OF CORRECTION

PATENT NO. : 3,997,765
DATED : December 14, 1976
INVENTOR(S) : Vijay V. Marathe

It is certified that error appears in the above-identified patent and that said Letters Patent are hereby corrected as shown below:

Column 3, Table I, under the heading "Input Digit", "$b_1 b_3 b_2 b_1$" should read -- $b_4 b_3 b_2 b_1$ --; Table II, under the heading "Input Digit", "$b_5 b_5 b_4 b_3 b_2 b_1$" should read -- $b_6 b_5 b_4 b_3 b_2 b_1$ --.

Signed and Sealed this

First Day of March 1977

[SEAL]

Attest:

RUTH C. MASON
*Attesting Officer*

C. MARSHALL DANN
*Commissioner of Patents and Trademarks*